United States Patent
Inaba

(10) Patent No.: US 8,481,908 B2
(45) Date of Patent: Jul. 9, 2013

(54) SOLID-STATE IMAGING DEVICE

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 13/038,691

(22) Filed: Mar. 2, 2011

(65) Prior Publication Data

US 2011/0220778 A1 Sep. 15, 2011

(30) Foreign Application Priority Data

Mar. 9, 2010 (JP) ................................. 2010-052078

(51) Int. Cl.
  *H01L 27/00* (2006.01)
  *H01L 31/00* (2006.01)
  *H01J 40/14* (2006.01)
  *H04N 3/14* (2006.01)

(52) U.S. Cl.
  USPC ................. 250/208.1; 250/214.1; 250/214 R; 257/440; 348/294

(58) Field of Classification Search
  USPC .............. 250/208.1, 214.1, 214 R, 216, 239, 250/214 A, 214 AL, 214 LS; 348/294, 311, 348/315, 322; 257/317–322, 343, 396, 440, 257/448; 349/27, 28, 33, 36, 47, 50–52, 78, 349/106, 108, 158; 345/4, 5, 22, 40, 88, 176, 345/690
  See application file for complete search history.

(56) References Cited

U.S. PATENT DOCUMENTS

| 7,411,620 B2 | 8/2008 | Taniguchi et al. | |
| 2004/0085598 A1* | 5/2004 | Kokeguchi et al. | ........ 358/909.1 |
| 2006/0119724 A1 | 6/2006 | Inuiya | |

FOREIGN PATENT DOCUMENTS

| JP | 2001217451 | 8/2001 |
| JP | 2005268471 | 9/2005 |
| JP | 2006-165037 | 6/2006 |
| JP | 2009054806 | 3/2009 |
| JP | 2009-123780 | 6/2009 |

OTHER PUBLICATIONS

Madigan, et al.; Improvement of output coupling efficiency of organic light-emitting diodes by backside substrate modification; Applied Physics Letters, vol. 76, No. 13; Mar. 27, 2000; pp. 1650-1652.
Seo, et al.; Color Sensors with Three Vertically Stacked Organic Photodetectors; Japanese Journal of Applied Physics, vol. 46, No. 49; 2007; pp. L1240-L1242.
Takada, et al.; CMOS Color Image Sensor Overlaid with Organic Photoelectric Conversion Layers: Depression of Dark Current; pp. 275-278.
Japanese Office Action for Japanese Application Serial No. 2010-052078 issued on Jul. 24, 2012.

* cited by examiner

*Primary Examiner* — Que T Le
*Assistant Examiner* — Don Williams
(74) *Attorney, Agent, or Firm* — Turocy & Watson, LLP

(57) ABSTRACT

According to one embodiments, a transparent reference electrode is provided to be sandwiched between a red-detecting photoelectric conversion film and a green-detecting photoelectric conversion film, a first transparent driving electrode is provided to face the transparent reference electrode with the green-detecting photoelectric conversion film therebetween, a second transparent driving electrode is provided to face the transparent reference electrode with the red-detecting photoelectric conversion film therebetween, and a blue-detecting photoelectric conversion film is provided below the red-detecting photoelectric conversion film and performs blue detection.

20 Claims, 5 Drawing Sheets

| TYPE | WAVELENGTH (nm) | | | | | | | | |
|---|---|---|---|---|---|---|---|---|---|
| | 1014.0 | 768.2 | 656.3 | 587.6 | 546.1 | 486.1 | 435.8 | 404.7 | 365.0 |
| FK1 | 1.4623 | 1.4660 | 1.4685 | 1.4707 | 1.4724 | 1.4755 | 1.4793 | 1.4823 | 1.4875 |
| BK7 | 1.5073 | 1.5115 | 1.5143 | 1.5168 | 1.5187 | 1.5224 | 1.5267 | 1.5302 | 1.5363 |
| K3 | 1.5083 | 1.5125 | 1.5155 | 1.5182 | 1.5203 | 1.5243 | 1.5291 | 1.5331 | 1.5399 |
| BaK4 | 1.5576 | 1.5623 | 1.5658 | 1.5688 | 1.5713 | 1.5759 | 1.5815 | 1.5861 | 1.5941 |
| SK5 | 1.5781 | 1.5828 | 1.5862 | 1.5891 | 1.5914 | 1.5958 | 1.6010 | 1.6053 | 1.6126 |
| SSK1 | 1.6048 | 1.6099 | 1.6137 | 1.6172 | 1.6199 | 1.6252 | 1.6315 | 1.6368 | 1.6459 |
| LaK3 | 1.6794 | 1.6852 | 1.6896 | 1.6935 | 1.6966 | 1.7025 | 1.7097 | 1.7156 | 1.7259 |
| KzF2 | 1.5180 | 1.5228 | 1.5263 | 1.5294 | 1.5319 | 1.5366 | 1.5422 | 1.5469 | 1.5551 |
| BaF10 | 1.6550 | 1.6611 | 1.6658 | 1.6700 | 1.6734 | 1.6800 | 1.6880 | 1.6948 | 1.7068 |
| LaF2 | 1.7262 | 1.7335 | 1.7390 | 1.7440 | 1.7479 | 1.7556 | 1.7649 | 1.7728 | 1.7867 |
| LF5 | 1.5667 | 1.5726 | 1.5772 | 1.5814 | 1.5848 | 1.5915 | 1.5996 | 1.6067 | 1.6192 |
| F2 | 1.6028 | 1.6096 | 1.6150 | 1.6200 | 1.6241 | 1.6321 | 1.6421 | 1.6507 | 1.6663 |
| SF2 | 1.6286 | 1.6361 | 1.6421 | 1.6477 | 1.6522 | 1.6612 | 1.6725 | 1.6823 | 1.7003 |
| SF13 | 1.7151 | 1.7248 | 1.7331 | 1.7408 | 1.7471 | 1.7598 | 1.7761 | 1.7907 | - |
| SFS1 | 1.8781 | 1.8927 | 1.9054 | 1.9176 | 1.9277 | 1.9484 | 1.9753 | 1.9997 | - |

ABBE NUMBER (RECIPROCAL DISPERSION)

US 8,481,908 B2

SOLID-STATE IMAGING DEVICE

CROSS-REFERENCE TO RELATED APPLICATIONS

This application is based upon and claims the benefit of priority from the prior Japanese Patent Application No. 2010-52078, filed on Mar. 9, 2010; the entire contents of which are incorporated herein by reference.

FIELD

Embodiments described herein relate generally to a solid-state imaging device.

BACKGROUND

As a method of improving sensitivity without sacrificing resolution of a solid-state imaging device, there is a method in which photoelectric conversion films whose detection wavelength range is different from each other are stacked on a semiconductor substrate. When stacking the photoelectric conversion films on the semiconductor substrate, a glass substrate is provided for each photoelectric conversion film sandwiched by transparent electrodes for enabling to support the photoelectric conversion film.

Moreover, there is a method in which a plurality of photoelectric conversion films is stacked on the semiconductor substrate, a common electrode film provided to a first photoelectric conversion film and a common electrode film provided to a second photoelectric conversion film are used in common, and the first photoelectric conversion film is stacked under the common electrode film and the second photoelectric conversion film is stacked on the common electrode film.

DETAILED DESCRIPTION

Figure 1:
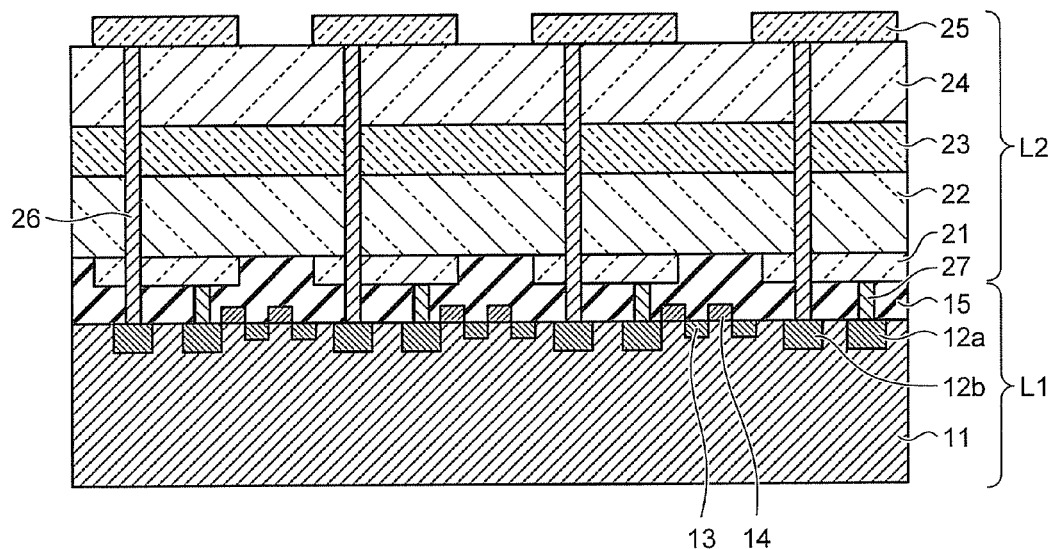
FIG. 1 is a cross-sectional view illustrating a schematic configuration of a solid-state imaging device according to a first embodiment.

In general, according to one embodiment, a red-detecting photoelectric conversion film, a green-detecting photoelectric conversion film, a transparent reference electrode, a first transparent driving electrode, a second transparent driving electrode, and a blue-detecting photoelectric conversion film are included. The red-detecting photoelectric conversion film is sensitive to red. The green-detecting photoelectric conversion film is provided above the red-detecting photoelectric conversion film and is sensitive to green. The transparent reference electrode is provided to be sandwiched between the red-detecting photoelectric conversion film and the green-detecting photoelectric conversion film and applies a reference voltage to the red-detecting photoelectric conversion film and the green-detecting photoelectric conversion film. The first transparent driving electrode is provided to face the transparent reference electrode with the green-detecting photoelectric conversion film therebetween and applies a first driving voltage to the green-detecting photoelectric conversion film. The second transparent driving electrode is provided to face the transparent reference electrode with the red-detecting photoelectric conversion film therebetween and applies a second driving voltage to the red-detecting photoelectric conversion film. The blue-detecting photoelectric conversion film is provided below the red-detecting photoelectric conversion film and performs blue detection.

There is a method in which photoelectric conversion films whose detection wavelength range is different from each other are stacked on a semiconductor substrate. When stacking the photoelectric conversion films on the semiconductor substrate, a glass substrate is provided for each photoelectric conversion film sandwiched by transparent electrodes for enabling to support the photoelectric conversion film.

With this method, whereas the refractive index of the glass substrate is about 1.5, the refractive index of the photoelectric conversion film is about 1.7 and the refractive index of the transparent electrode is about 1.8. Therefore, loss of incident light occurs due to the refractive index difference between the transparent electrode and the glass substrate, which may cause decrease in photosensitivity of a solid-state imaging device.

Moreover, there is a method in which a plurality of photoelectric conversion films is stacked on the semiconductor substrate, a common electrode film provided to a first photoelectric conversion film and a common electrode film provided to a second photoelectric conversion film are used in common, and the first photoelectric conversion film is stacked under the common electrode film and the second photoelectric conversion film is stacked on the common electrode film.

With this method, a green-detecting photoelectric conversion film is provided under a blue-detecting photoelectric conversion film. Therefore, transmission of green light is hindered in the blue-detecting photoelectric conversion film, and it may become difficult to adapt to photosusceptibility of human eye to green.

Moreover, with this method, the blue-detecting photoelectric conversion film and the green-detecting photoelectric conversion film are electrically separated via a dielectric film. Therefore, when the driving voltage of the blue-detecting photoelectric conversion film and the driving voltage of the green-detecting photoelectric conversion film are different from each other, the driving voltages may interfere between these photoelectric conversion films.

Furthermore, with this method, because the green-detecting photoelectric conversion film is be provided over a red-detecting photoelectric conversion film, the red-detecting photoelectric conversion film needs to be penetrated by a plug electrode that applies the driving voltage to the green-detecting photoelectric conversion film, so that the area that functions effectively as a pixel may decrease.

Exemplary embodiments of a solid-state imaging device will be explained below in detail with reference to the accompanying drawings. The present invention is not limited to these embodiments.

First Embodiment

FIG. 1 is a cross-sectional view illustrating a schematic configuration of a solid-state imaging device according to the first embodiment.

In FIG. 1, in the solid-state imaging device, a stacked photosensitive layer L2 and a circuit layer L1 are provided and the stacked photosensitive layer L2 is provided on the circuit layer L1. The stacked photosensitive layer L2 can perform photoelectric conversion for each color and the circuit layer L1 can form a circuit that reads out a signal photoelectrically converted in the stacked photosensitive layer L2.

In the circuit layer L1, impurity diffusion layers 12a, 12b, and 13 are formed in a semiconductor substrate 11 and a gate electrode 14 is formed on the semiconductor substrate 11 to form a diode, a transistor, or the like.

Moreover, in the stacked photosensitive layer L2, a red-detecting photoelectric conversion film 22 and a green-detecting photoelectric conversion film 24 are provided. A transparent driving electrode 21 is provided separately for each pixel on the semiconductor substrate 11 via an inter-layer dielectric layer 15. The red-detecting photoelectric conversion film 22 is formed on the transparent driving electrode 21, and the green-detecting photoelectric conversion film 24 is stacked on the red-detecting photoelectric conversion film 22 via a transparent reference electrode 23. Moreover, a transparent driving electrode 25 is provided separately for each pixel on the green-detecting photoelectric conversion film 24.

As a material of the red-detecting photoelectric conversion film 22 and the green-detecting photoelectric conversion film 24, for example, an organic film can be used. Moreover, as a material of the transparent driving electrodes 21 and 25 and the transparent reference electrode 23, for example, ITO (indium oxide) can be used. Furthermore, a reference potential such as a ground potential can be applied to the transparent reference electrode 23. Moreover, the driving voltages applied from the transparent driving electrodes 21 and 25 are preferably set to the same value.

Moreover, the transparent driving electrode 21 is connected to the impurity diffusion layer 12a via a plug electrode 27 and the transparent driving electrode 25 is connected to the impurity diffusion layer 12b via a plug electrode 26. The plug electrode 27 can penetrate through the inter-layer dielectric layer 15 and the plug electrode 26 can penetrate through the green-detecting photoelectric conversion film 24, the transparent reference electrode 23, the red-detecting photoelectric conversion film 22, the transparent driving electrode 21, and the inter-layer dielectric layer 15.

In the case of causing the solid-state imaging device to perform blue detection, a blue-detecting photoelectric conversion layer can be formed in the semiconductor substrate 11 or a blue-detecting photoelectric conversion film can be provided between the red-detecting photoelectric conversion film 22 and the semiconductor substrate 11.

Consequently, the green-detecting photoelectric conversion film 24 can be provided above the red-detecting photoelectric conversion film 22 and the blue-detecting photoelectric conversion layer, and a glass substrate inserted between the green-detecting photoelectric conversion film 24 and the red-detecting photoelectric conversion film 22 can be omitted. Therefore, green can be efficiently absorbed in the circuit layer L1, so that it becomes possible to adapt to susceptibility of human eye to green and loss of incident light due to the refractive index difference from the glass substrate can be eliminated, enabling to improve sensitivity without sacrificing resolution of the solid-state imaging device.

For example, the refractive index of the red-detecting photoelectric conversion film 22 and the green-detecting photoelectric conversion film 24 is about 1.7 and the refractive index of the transparent driving electrodes 21 and 25 and the transparent reference electrode 23 is about 1.8. If the glass substrate is inserted between the green-detecting photoelectric conversion film 24 and the red-detecting photoelectric conversion film 22 and the refractive index of the glass substrate is about 1.5, the refractive index difference of about 0.3 occurs between the transparent driving electrode 21 and the glass substrate and thus the total reflection angle when light enters the transparent driving electrode 21 from the glass substrate becomes small, so that the light intensity transmitting through the glass substrate is reduced and the light intensity entering the red-detecting photoelectric conversion film 22 is reduced.

On the other hand, if the glass substrate is not inserted between the green-detecting photoelectric conversion film 24 and the red-detecting photoelectric conversion film 22, the green-detecting photoelectric conversion film 24 and the red-detecting photoelectric conversion film 22 can be provided to come into contact with the transparent reference electrode 23. The refractive index difference between the green-detecting photoelectric conversion film 24 and the red-detecting photoelectric conversion film 22 and the transparent reference electrode 23 is about 0.1, so that the total reflection angle when light enters the transparent reference electrode 23 can be made large. Consequently, reduction of the light intensity transmitting through the transparent reference electrode 23 can be suppressed, so that the light intensity entering the red-detecting photoelectric conversion film 22 can be increased.

Figure 2:
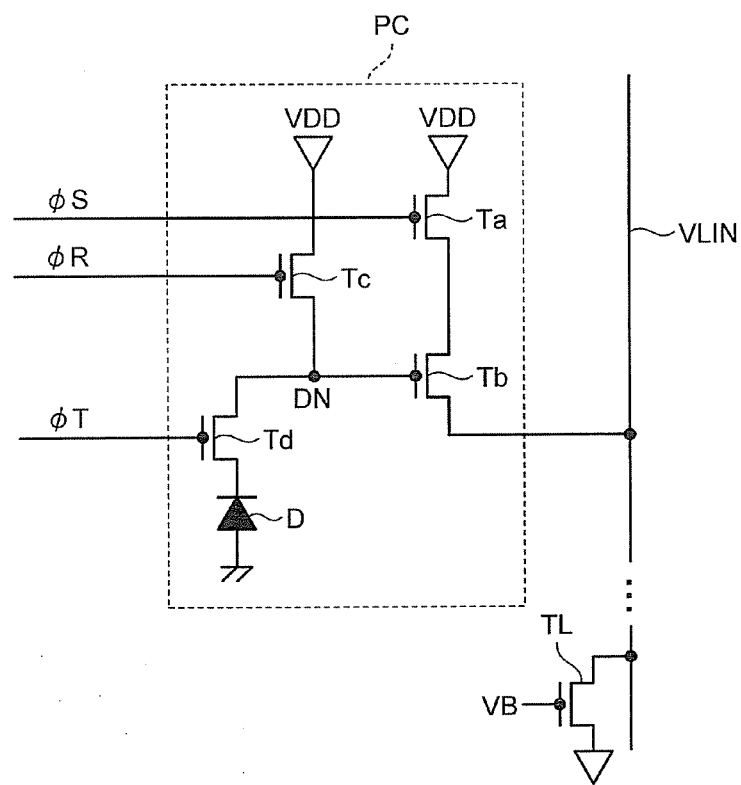
FIG. 2 is a diagram illustrating an equivalent circuit configuration for one pixel of the solid-state imaging device according to the first embodiment.

FIG. 2 is a diagram illustrating an equivalent circuit configuration for one pixel of the solid-state imaging device according to the first embodiment.

In FIG. 2, in each pixel PC of the solid-state imaging device, a diode D, a floating diffusion DN, a row select transistor Ta, an amplifying transistor Tb, a reset transistor Tc, and a readout transistor Td are provided. The diode D can be composed of the impurity diffusion layer 12a or the impurity diffusion layer 12b in FIG. 1 and accumulate charges photoelectrically converted in the red-detecting photoelectric conversion film 22 or the green-detecting photoelectric conversion film 24. Moreover, the row select transistor Ta, the amplifying transistor Tb, the reset transistor Tc, and the readout transistor Td can be composed of the impurity diffusion layer 13 and the gate electrode 14 in FIG. 1.

The readout transistor Td can read out charges accumulated in the diode D. The floating diffusion DN can detect the charges read out in the readout transistor Td. The reset transistor Tc can reset the floating diffusion DN. The amplifying transistor Tb can amplify a signal detected in the floating diffusion DN. The row select transistor Ta can select the pixel PC read out in the readout transistor Td in a row direction.

The source of the readout transistor Td is connected to the diode D and a readout signal DT is input to the gate of the readout transistor Td. Moreover, the source of the reset transistor Tc is connected to the drain of the readout transistor Td, a reset signal ΦR is input to the gate of the reset transistor Tc, and the drain of the reset transistor Tc is connected to a power supply potential VDD. Furthermore, a row selection signal ΦS is input to the gate of the row select transistor Ta, and the drain of the row select transistor Ta is connected to the power supply potential VDD. Moreover, the source of the amplifying transistor Tb is connected to a vertical signal line VLIN, the gate of the amplifying transistor Tb is connected to the drain of the readout transistor Td, and the drain of the amplifying transistor Tb is connected to the source of the row select transistor Ta.

The floating diffusion DN is formed at a connection point of the gate of the amplifying transistor Tb and the drain of the readout transistor Td. Moreover, a drain of a load transistor TL is connected to the vertical signal line VLIN and a bias signal VB is input to the gate of the load transistor TL. The load transistor TL configures a source follower to be able to perform a constant current operation.

When the reset signal ΦR becomes a high level, the reset transistor Tc is turned on and charges of the floating diffusion DN are reset. Then, when the readout signal ΦT becomes a high level, the readout transistor Td is turned on, charges accumulated in the diode D are transferred to the floating diffusion DN, and the potential corresponding to the charges transferred to the floating diffusion DN is applied to the gate of the amplifying transistor Tb.

Because the amplifying transistor Tb and the load transistor TL form a source follower, the voltage of the vertical signal line VLIN follows the voltage applied to the gate of the amplifying transistor Tb.

Second Embodiment

Figure 3A:
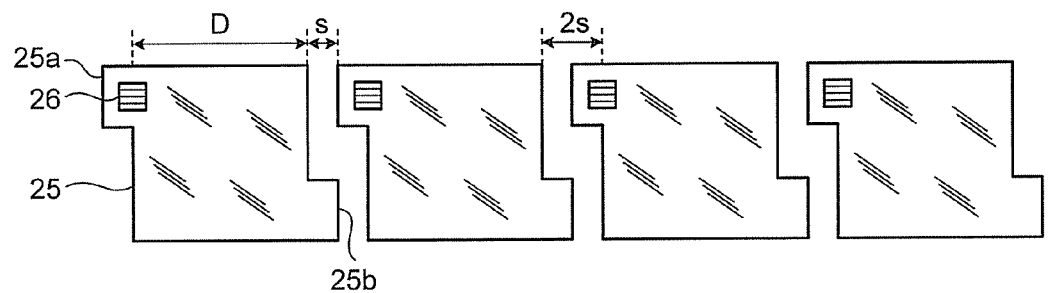
FIG. 3A to 3C are plan views illustrating a layout configuration of each layer of a stacked photosensitive layer of a solid-state imaging device according to a second embodiment.
Figure 3B:
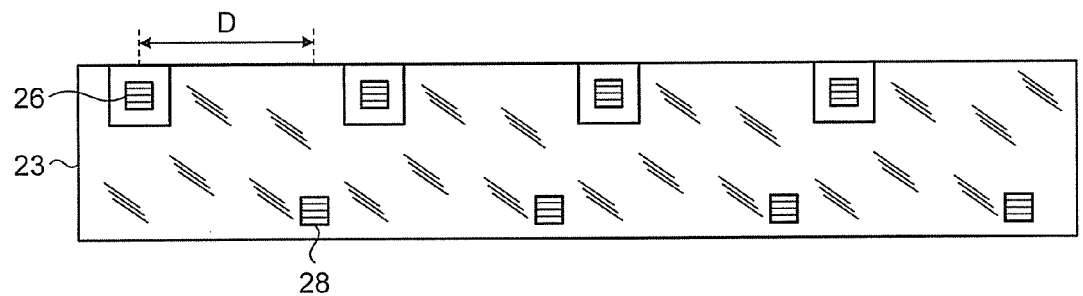
Figure 3C:
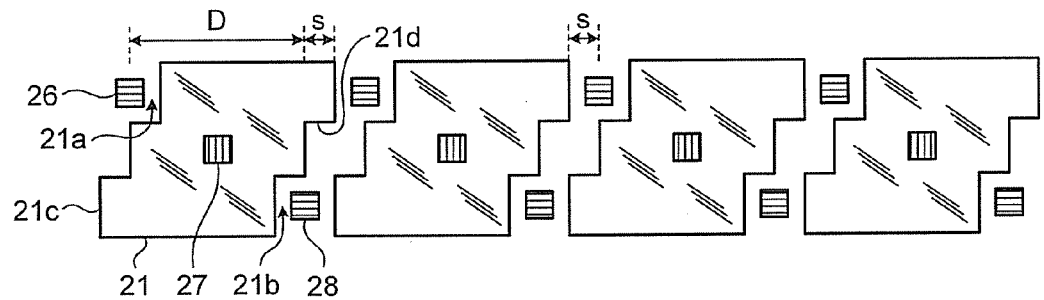

FIG. 3A, FIG. 3B, and FIG. 3C are plan views illustrating a layout configuration of each layer of a stacked photosensitive layer of a solid-state imaging device according to the second embodiment.

In FIG. 3A, protrusion regions 25a and 25b are added to the transparent driving electrode 25. The protrusion region is a region added to an electrode. In a plan view, the protrusion region is a region that protrudes in a direction of an adjacent transparent driving electrode. For example, this protrusion region can have a rectangular shape. Moreover, the protrusion regions 25a and 25b can be provided at diagonal positions of the transparent driving electrode 25 to be point-symmetrical with each other. Furthermore, the shape of the transparent driving electrode 25 without the protrusion regions 25a and 25b can be a square with a side length of D. Moreover, the interval between the transparent driving electrodes 25 without the protrusion regions 25a and 25b can be 2 s, in which s is a minimum interval between the transparent driving electrodes 25. In FIG. 3A, the protrusion region 25a protrudes by the length of s in a left direction and the protrusion region 25b protrudes by the length of s in a right direction.

Moreover, in FIG. 3C, recess regions 21a and 21b in line symmetry with respect to the protrusion regions 25a and 25b are formed in the transparent driving electrode 21. The recess region is a region formed by removing part of an electrode. This recess region can, for example, have a rectangular shape. Moreover, the recess regions 21a and 21b can be provided at diagonal positions of the transparent driving electrode 21 to be point-symmetrical with each other. Furthermore, protrusion regions 21c and 21d are added to the transparent driving electrode 21 to compensate for the area of the recess regions 21a and 21b. The protrusion regions 21c and 21d can be provided at diagonal positions of the transparent driving electrode 21 to be point-symmetrical with each other. Moreover, the protrusion amount of the protrusion regions 25a and 25b and the protrusion regions 21c and 21d and the recess amount of the recess regions 21a and 21b can be set to the minimum interval s between the transparent driving electrodes 25.

In FIG. 3B, the plug electrode 26 is connected to the transparent driving electrode 25 so that part thereof overlaps with the protrusion region 25a while avoiding contact with the transparent driving electrode 21 by passing through the recess region 21a. It is preferable to provide the plug electrode 26 so that a half region of the plug electrode 26 overlaps with the protrusion region 25a and the remaining half region of the plug electrode 26 overlaps with the recess region 21a. Moreover, the plug electrode 27 is connected to the center of the transparent driving electrode 21. Furthermore, a plug electrode 28 is connected to the transparent reference electrode 23 while avoiding contact with the transparent driving electrode 21 by passing through the recess region 21b.

The protrusion regions 25a and 25b are added to the transparent driving electrode 25 and the recess regions 21a and 21b are formed in the transparent driving electrode 21, so that while enabling to provide the plug electrode 26 not to come into contact with the transparent driving electrode 21, the interval between the transparent driving electrodes 25 can be set to the minimum interval s, whereby the area of the transparent driving electrode 25 for one pixel can be made large.

Moreover, the protrusion regions 21c and 21b are added to the transparent driving electrode 21 to compensate for the area of the recess regions 21a and 21b, so that the area of the transparent driving electrode 21 can be ensured by $D^2$, enabling to prevent reduction of the area of the transparent driving electrode 21.

Third Embodiment

Figure 4:
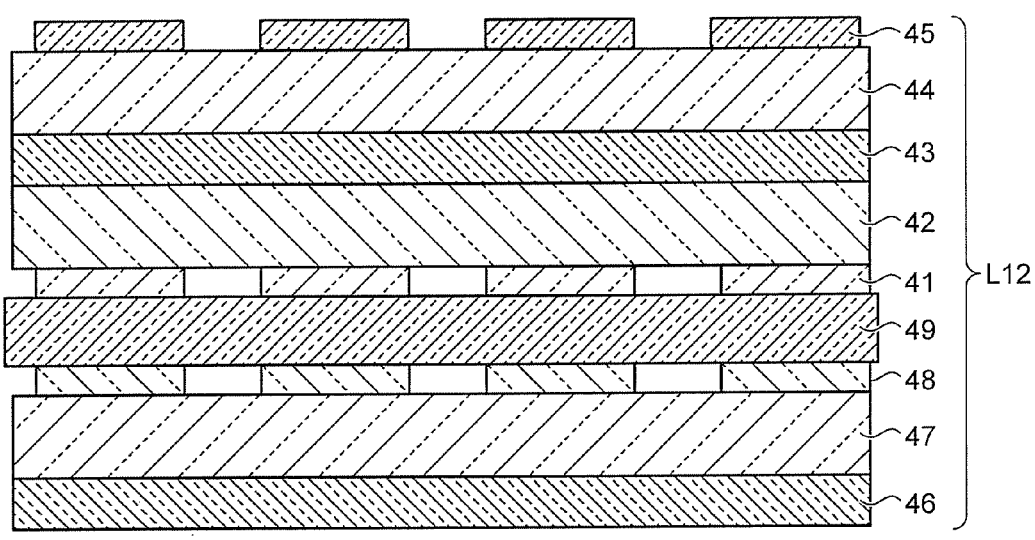
FIG. 4 is a cross-sectional view illustrating a schematic configuration of a photosensitive layer of a solid-state imaging device according to a third embodiment.

FIG. 4 is a cross-sectional view illustrating a schematic configuration of a photosensitive layer of a solid-state imaging device according to the third embodiment.

In FIG. 4, in a stacked photosensitive layer L12, a red-detecting photoelectric conversion film 42, a green-detecting photoelectric conversion film 44, and a blue-detecting photoelectric conversion film 47 are provided.

A transparent driving electrode 41 is provided separately for each pixel on a glass substrate 49. The red-detecting photoelectric conversion film 42 is formed on the transparent driving electrode 41, and the green-detecting photoelectric conversion film 44 is stacked on the red-detecting photoelectric conversion film 42 via a transparent reference electrode 43. Moreover, a transparent driving electrode 45 is provided separately for each pixel on the green-detecting photoelectric conversion film 44.

On the other hand, a transparent driving electrode 48 is provided separately for each pixel under the glass substrate 49 to face the transparent driving electrode 41 with the glass substrate 49 therebetween and the blue-detecting photoelectric conversion film 47 is provided under the transparent driving electrode 48. Moreover, a transparent reference electrode 46 is provided under the blue-detecting photoelectric conversion film 47.

As materials of the red-detecting photoelectric conversion film 42, the green-detecting photoelectric conversion film 44, and the blue-detecting photoelectric conversion film 47, for example, organic films can be used. Moreover, as a material of the transparent driving electrodes 41, 45, and 48, and the transparent reference electrodes 43 and 46, for example, ITO (indium oxide) can be used. Furthermore, a reference potential such as a ground potential can be applied to the transparent reference electrodes 43 and 46. Moreover, the driving voltages applied from the transparent driving electrodes 41 and 45 are preferably set to the same value. Furthermore, the value of the driving voltage applied from the transparent driving electrode 48 can be made larger than the value of the driving voltage applied from the transparent driving electrodes 41 and 45.

The green-detecting photoelectric conversion film 44 is provided above the red-detecting photoelectric conversion film 42 and the blue-detecting photoelectric conversion film 47, so that green light can be caused to enter the green-detecting photoelectric conversion film 44 without transmission of the green light being hindered in the red-detecting photoelectric conversion film 42 and the blue-detecting photoelectric conversion film 47, whereby it becomes possible to adapt to susceptibility of human eye to green.

Moreover, the transparent reference electrode 43 is sandwiched by the red-detecting photoelectric conversion film 42 and the green-detecting photoelectric conversion film 44, so that the glass substrate does not need to be inserted between the red-detecting photoelectric conversion film 42 and the green-detecting photoelectric conversion film 44, enabling to reduce loss of incident light due to the refractive index difference from the glass substrate.

Furthermore, the glass substrate 49 is inserted between the red-detecting photoelectric conversion film 42 and the blue-detecting photoelectric conversion film 47, so that the insulation property between the transparent driving electrodes 41 and 48 can be improved and loss of incident light due to the refractive index difference from the glass substrate 49 can be prevented from occurring in the red-detecting photoelectric conversion film 42 and the green-detecting photoelectric conversion film 44. Therefore, even when the driving voltage applied from the transparent driving electrode 48 is larger than the driving voltage applied from the transparent driving electrode 41, the driving voltages are prevented from interfering between the red-detecting photoelectric conversion film 42 and the blue-detecting photoelectric conversion film 47 while suppressing decrease in sensitivity of the solid-state imaging device.

In the above embodiment, explanation is given for the method in which the glass substrate 49 is inserted between the transparent driving electrodes 41 and 48; however, it is possible to use an acrylic or polycarbonate transparent resin substrate or the like instead of the glass substrate 49.

When the refractive index of the red-detecting photoelectric conversion film 42, the green-detecting photoelectric conversion film 44, and the blue-detecting photoelectric conversion film 47 is about 1.7, and the refractive index of the transparent driving electrodes 41, 45, and 48 and the transparent reference electrodes 43 and 46 is about 1.8, if the refractive index of the glass substrate is about 1.5, the refractive index difference of about 0.3 occurs between the transparent driving electrode 48 and the glass substrate 49 and thus the total reflection angle when light enters the transparent driving electrode 48 from the glass substrate 49 becomes small, so that the light intensity transmitting through the glass substrate 49 is reduced and the light intensity entering the blue-detecting photoelectric conversion film 47 is reduced.

Therefore, preferably, the refractive index of the glass substrate 49 is set so that the refractive index difference from the transparent driving electrode 48 is 0.1 or less, and more preferably, the refractive index of the glass substrate 49 is set to be the same as the refractive index of the transparent driving electrode 48.

Figures 5, 6:
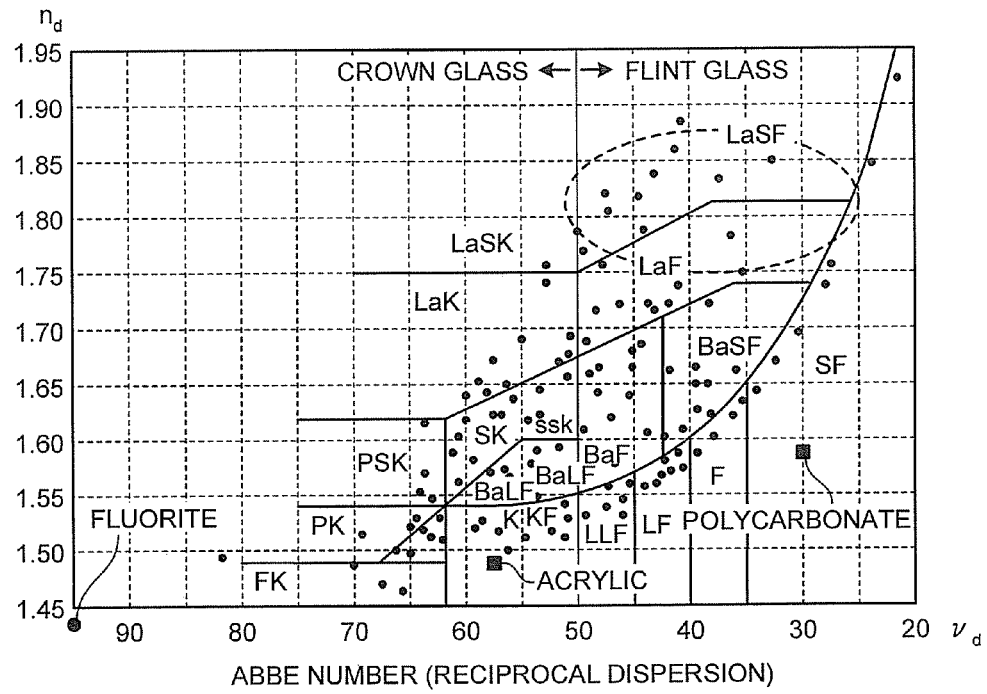
FIG. 5 is a table showing a relationship between a type of a glass substrate used in the stacked photosensitive layer in FIG. 4 and a refractive index.
FIG. 6 is a diagram illustrating a relationship between the refractive index of the glass substrate used in the stacked photosensitive layer in FIG. 4 and dispersion.

FIG. 5 is a diagram illustrating a relationship between a type of the glass substrate used in the stacked photosensitive layer in FIG. 4 and the refractive index.

In FIG. 5, the refractive index of an optical glass takes a value of about 1.4 to 2.0 depending on the type of the optical glass. Specially, if the refractive index of the red-detecting photoelectric conversion film 42, the green-detecting photoelectric conversion film 44, and the blue-detecting photoelectric conversion film 47 is about 1.7, and the refractive index of the transparent driving electrodes 41, 45, and 48 and the transparent reference electrodes 43 and 46 is about 1.8, it is preferable to use LaF2, SF13, or SFS1 shown in the dotted frame as a material of the glass substrate 49 for reducing loss of incident light due to the refractive index difference from the glass substrate 49.

FIG. 6 is a diagram illustrating a relationship between the refractive index of the glass substrate used in the stacked photosensitive layer in FIG. 4 and dispersion.

In the example in FIG. 6, a vertical axis indicates a refractive index $n_d$ and a horizontal axis indicates an Abbe number (reciprocal dispersion) $v_d$.

In FIG. 6, the refractive index and the dispersion tend to be high in a flint glass and the refractive index and the dispersion tend to be low in a crown glass. In order to reduce loss of incident light due to the refractive index difference from the glass substrate 49, it is preferable to select a part shown in the dotted frame in the flint glass as a material of the glass substrate 49.

Fourth Embodiment

Figure 7A:
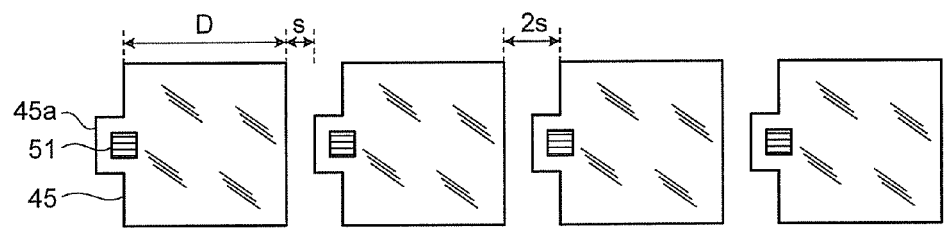
FIG. 7A to 7C are plan views illustrating a layout configuration of each layer of a stacked photosensitive layer of a solid-state imaging device according to a fourth embodiment.
Figure 7B:
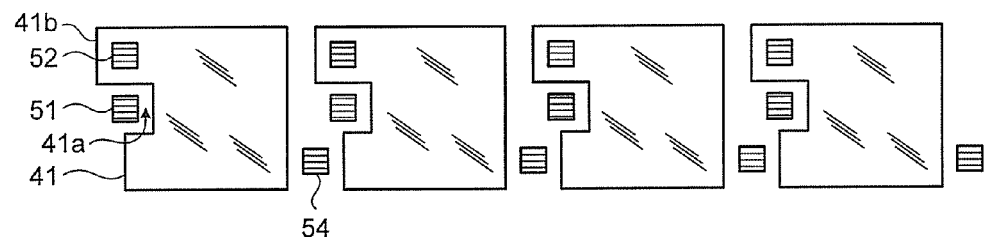
Figure 7C:
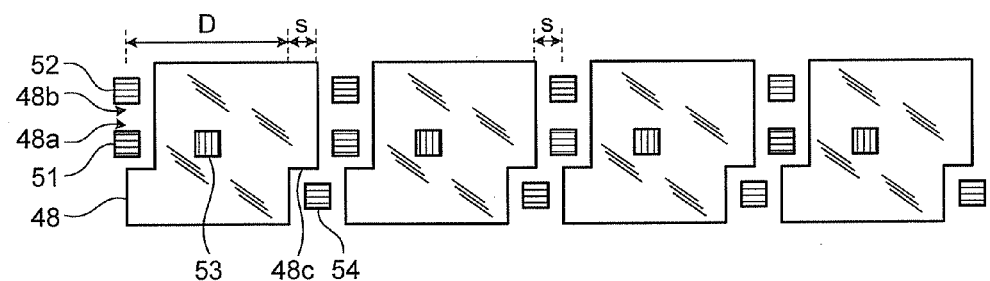

FIG. 7A, FIG. 7B, and FIG. 7C are plan views illustrating a layout configuration of each layer of a stacked photosensitive layer of a solid-state imaging device according to the fourth embodiment.

In FIG. 7A, a protrusion region 45a is added to the transparent driving electrode 45. The shape of the transparent driving electrode 45 without the protrusion region 45a can be a square with a side length of D. Moreover, the interval between the transparent driving electrodes 45 without the protrusion region 45a can be 2s, in which s is a minimum interval between the transparent driving electrodes 45. The protrusion region 45a protrudes by the length corresponding to s in a left direction in FIG. 7A. In FIG. 7B, a recess region 41a in line symmetry with respect to the protrusion region 45a is formed in the transparent driving electrode 41. Moreover, a protrusion region 41b is added to the transparent driving electrode 41 to compensate for the area of the recess region 41a. The protrusion region 41b protrudes by the length corresponding to s in a left direction in FIG. 7B. The recess region 41a is recessed by the length corresponding to s in a right direction in FIG. 7B.

Moreover, in FIG. 7C, a recess region 48a in line symmetry with respect to the protrusion region 45a is formed in the transparent driving electrode 48. Furthermore, a recess region 48b in line symmetry with respect to the protrusion region 41b is formed in the transparent driving electrode 48. Moreover, a protrusion region 48c is added to the transparent driving electrode 48 to compensate for the area of the recess regions 48a and 48b.

A plug electrode 51 is connected to the transparent driving electrode 45 so that part thereof overlaps with the protrusion region 45a while avoiding contact with the transparent driving electrode 48 by passing through the recess region 48a and avoiding contact with the transparent driving electrode 41 by passing through the recess region 41a. It is preferable to provide the plug electrode 51 so that a half region of the plug electrode 51 overlaps with the protrusion region 45a and the remaining half region of the plug electrode 51 overlaps with the recess regions 41a and 48a.

Moreover, a plug electrode 52 is connected to the transparent driving electrode 41 so that part thereof overlaps with the protrusion region 41b while avoiding contact with the transparent driving electrode 48 by passing through the recess region 48b. It is preferable to provide the plug electrode 52 so that a half region of the plug electrode 52 overlaps with the protrusion region 41b and the remaining half region of the plug electrode 52 overlaps with the recess region 48b. Moreover, a plug electrode 53 is connected to the center of the transparent driving electrode 48.

Furthermore, a plug electrode 54 is connected to the transparent reference electrode 43 while avoiding contact with the transparent driving electrodes 48 and 41 by passing through the gap between the transparent driving electrodes 48 and the gap between the transparent driving electrodes 41.

The protrusion region 45a is added to the transparent driving electrode 45 and the recess regions 41a and 48a are formed in the transparent driving electrodes 41 and 48, respectively, so that the plug electrode 51 can be provided not to come into contact with the transparent driving electrodes 41 and 48 and the area of the transparent driving electrode 45 can be made larger than $D^2$, enabling to increase the area of the transparent driving electrode 45.

Moreover, the protrusion region 41b is added to the transparent driving electrode 41 and the recess region 48b is formed in the transparent driving electrode 48, so that the plug electrode 52 can be provided not to come into contact with the transparent driving electrode 48 and the area of the transparent driving electrode 41 can be ensured by $D^2$, enabling to prevent reduction of the area of the transparent driving electrode 41.

Furthermore, the protrusion region 48c is added to the transparent driving electrode 48 to compensate for the area of the recess regions 48a and 48b, so that the area of the transparent driving electrode 48 can be ensured by $D^2$, enabling to prevent reduction of the area of the transparent driving electrode 48.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a red-detecting photoelectric conversion film sensitive to red that is provided above a substrate;
   a green-detecting photoelectric conversion film sensitive to green that is provided above the red-detecting photoelectric conversion film;
   a transparent reference electrode that is sandwiched between the red-detecting photoelectric conversion film and the green-detecting photoelectric conversion film and applies a reference voltage to the red-detecting photoelectric conversion film and the green-detecting photoelectric conversion film;
   a first transparent driving electrode that is provided to face the transparent reference electrode with the green-detecting photoelectric conversion film therebetween and applies a first driving voltage to the green-detecting photoelectric conversion film;
   a second transparent driving electrode that is provided to face the transparent reference electrode with the red-detecting photoelectric conversion film therebetween and applies a second driving voltage to the red-detecting photoelectric conversion film; and
   a blue-detecting photoelectric conversion film that is provided below the red-detecting photoelectric conversion film and performs blue detection.

2. The solid-state imaging device according to claim 1, further comprising a circuit layer that reads out a signal photoelectrically converted in the red-detecting photoelectric conversion film, the green-detecting photoelectric conversion film, and the blue-detecting photoelectric conversion film.

3. The solid-state imaging device according to claim 2, wherein
   the circuit layer includes
      a diode that accumulates charges photoelectrically converted in the red-detecting photoelectric conversion film or the green-detecting photoelectric conversion film,
      a readout transistor that reads out charges accumulated in the diode,
      a floating diffusion that detects charges read out in the readout transistor,
      a reset transistor that resets the floating diffusion,
      an amplifying transistor that amplifies a signal detected in the floating diffusion, and
      a row select transistor that selects a pixel read out in the readout transistor in a row direction.

4. The solid-state imaging device according to claim 1, wherein driving voltages applied from the first transparent driving electrode and the second transparent driving electrode are set to a same value.

5. The solid-state imaging device according to claim 1, further comprising:
   a first protrusion region that is formed in the first transparent driving electrode;
   a first recess region that is formed in the second transparent driving electrode to be line-symmetrical with respect to the first protrusion region;
   a first plug electrode that is connected to the first transparent driving electrode to pass through the first recess region and overlap with the first protrusion region in part thereof, and transmits the first driving voltage to the first transparent driving electrode; and
   a second plug electrode that is connected to the second transparent driving electrode and transmits the second driving voltage to the second transparent driving electrode.

6. The solid-state imaging device according to claim 5, wherein a protrusion amount of the first protrusion region and a recess amount of the first recess region are set to a minimum interval between the first transparent driving electrodes.

7. The solid-state imaging device according to claim 5, further comprising a second protrusion region that is added to the second transparent driving electrode to compensate for a reduced amount of an area of the first recess region.

8. The solid-state imaging device according to claim 5, further comprising:
   a second recess region that is formed in the second transparent driving electrode to be point-symmetrical with respect to the first recess region; and
   a third plug electrode that passes through the second recess region and is connected to the transparent reference electrode.

9. A solid-state imaging device comprising:
   a red-detecting photoelectric conversion film sensitive to red that is provided above a substrate;

a green-detecting photoelectric conversion film sensitive to green that is provided above the red-detecting photoelectric conversion film;
a first transparent reference electrode that is provided to be sandwiched between the red-detecting photoelectric conversion film and the green-detecting photoelectric conversion film and applies a reference voltage to the red-detecting photoelectric conversion film and the green-detecting photoelectric conversion film;
a first transparent driving electrode that is provided separately for each pixel to face the first transparent reference electrode with the green-detecting photoelectric conversion film therebetween, and applies a first driving voltage to the green-detecting photoelectric conversion film;
a second transparent driving electrode that is provided separately for each pixel to face the first transparent reference electrode with the red-detecting photoelectric conversion film therebetween, and applies a second driving voltage to the red-detecting photoelectric conversion film;
a blue-detecting photoelectric conversion film sensitive to blue that is provided below the red-detecting photoelectric conversion film;
a third transparent driving electrode that is provided separately for each pixel above the blue-detecting photoelectric conversion film and applies a third driving voltage to the blue-detecting photoelectric conversion film;
a second transparent reference electrode that is provided to face the third transparent driving electrode with the blue-detecting photoelectric conversion film therebetween, and applies a reference voltage to the blue-detecting photoelectric conversion film; and
a transparent substrate that is provided to be sandwiched between the second transparent driving electrode and the third transparent driving electrode.

10. The solid-state imaging device according to claim 9, wherein a refractive index difference in at least one combination of the transparent driving electrode and the transparent substrate is 0.1 or less.

11. The solid-state imaging device according to claim 10, wherein the transparent substrate is a glass substrate.

12. The solid-state imaging device according to claim 11, wherein the glass substrate is a flint glass.

13. The solid-state imaging device according to claim 9, further comprising:
a first protrusion region that is formed in the first transparent driving electrode;
a second protrusion region that is formed in the second transparent driving electrode;
a first recess region that is formed in the third transparent driving electrode to be line-symmetrical with respect to the first protrusion region;
a second recess region that is formed in the third transparent driving electrode to be line-symmetrical with respect to the second protrusion region;
a third recess region that is formed in the second transparent driving electrode to be line-symmetrical with respect to the second protrusion region;
a first plug electrode that is connected to the first transparent driving electrode to pass through the second recess region and the third recess region and overlap with the first protrusion region in part thereof, and transmits the first driving voltage to the first transparent driving electrode;
a second plug electrode that is connected to the second transparent driving electrode to pass through the first recess region and overlap with the second protrusion region in part thereof, and transmits the second driving voltage to the second transparent driving electrode; and
a third plug electrode that is connected to the third transparent driving electrode and transmits the third driving voltage to the third transparent driving electrode.

14. The solid-state imaging device according to claim 9, wherein a driving voltage applied from the third transparent driving electrode is larger than a driving voltage applied from the first transparent driving electrode and the second transparent driving electrode.

15. A solid-state imaging device comprising:
a red-detecting photoelectric conversion film sensitive to red that is provided above a substrate;
a green-detecting photoelectric conversion film sensitive to green that is provided above the red-detecting photoelectric conversion film;
a transparent reference electrode that is provided to be sandwiched between the red-detecting photoelectric conversion film and the green-detecting photoelectric conversion film and applies a reference voltage to the red-detecting photoelectric conversion film and the green-detecting photoelectric conversion film;
a first transparent driving electrode which is provided separately for each pixel to face the transparent reference electrode with the green-detecting photoelectric conversion film therebetween and to which the first protrusion region is added, and which applies a first driving voltage to the green-detecting photoelectric conversion film;
a second transparent driving electrode which is provided separately for each pixel to face the transparent reference electrode with the red-detecting photoelectric conversion film therebetween and in which a first recess region is formed to be line-symmetrical with respect to the first protrusion region, and which applies a second driving voltage to the red-detecting photoelectric conversion film;
a first plug electrode that is connected to the first transparent driving electrode to pass through the first recess region and overlap with the first protrusion region in part thereof, and transmits the first driving voltage to the first transparent driving electrode; and
a second plug electrode that is connected to the second transparent driving electrode and transmits the second driving voltage to the second transparent driving electrode.

16. The solid-state imaging device according to claim 15, wherein a half of the first plug electrode is provided in the first protrusion region and a remaining half of the first plug electrode is provided in the first transparent driving electrode.

17. The solid-state imaging device according to claim 16, wherein a protrusion amount of the first protrusion region and a recess amount of the first recess region are set to a minimum interval between the first transparent driving electrodes.

18. The solid-state imaging device according to claim 16, further comprising a second protrusion region that is formed in the second transparent driving electrode, wherein
the second protrusion region has an area approximately same as a reduced amount of an area of the first recess region.

19. The solid-state imaging device according to claim 16, further comprising:
a second recess region that is formed in the second transparent driving electrode to be point-symmetrical with respect to the first recess region; and
a third plug electrode that passes through the second recess region and is connected to the transparent reference electrode.

20. The solid-state imaging device according to claim 16, wherein a plane shape of the first transparent driving electrode to which the first protrusion region is not added and the second transparent driving electrode in which the first recess region is not formed is square.

\* \* \* \* \*